(12) United States Patent
Okazaki et al.

(10) Patent No.: US 7,786,797 B2
(45) Date of Patent: Aug. 31, 2010

(54) AMPLIFYING APPARATUS

(75) Inventors: Yousuke Okazaki, Kawasaki (JP);
Hiroaki Maeda, Kawasaki (JP);
Takashi Ono, Kawasaki (JP); Hirotake Honda, Kawasaki (JP); Yoshinobu Shizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/580,802

(22) Filed: Oct. 16, 2009

(65) Prior Publication Data
US 2010/0033243 A1 Feb. 11, 2010

Related U.S. Application Data

(63) Continuation of application No. PCT/JP2007/058659, filed on Apr. 20, 2007.

(51) Int. Cl.
H03F 3/68 (2006.01)
(52) U.S. Cl. .................... 330/124 R; 330/295
(58) Field of Classification Search ......... 330/295, 330/124 R, 84, 286, 53
See application file for complete search history.

(56) References Cited
U.S. PATENT DOCUMENTS
5,786,727 A 7/1998 Sigmon 6,232,841 B1 5/2001 Bartlett et al.
6,472,934 B1 * 10/2002 Pehlke .......................... 330/10

FOREIGN PATENT DOCUMENTS

| | | |
|---|---|---|
| JP | 7142937 | 6/1995 |
| JP | 2001502493 | 2/2001 |
| JP | 2003504906 | 2/2003 |
| JP | 2003188651 | 7/2003 |

OTHER PUBLICATIONS

S.C. Cripps "Switching Mode Amplifiers for RF Applications", RF Power Amplifiers for Wireless Communication, Artech House, pp. 145-178, 1999.
International Search Report dated Jul. 10, 2007.

* cited by examiner

Primary Examiner—Robert Pascal
Assistant Examiner—Hieu P Nguyen
(74) Attorney, Agent, or Firm—Hanify & King, P.C.

(57) ABSTRACT

The amplifying apparatus includes an amplifier having a circuit constant determined so as to satisfy a condition for E-class operation; power detecting unit which detects an output electricity from the amplifier; and controlling unit which controls the circuit constant in accordance with the output power detected by the power detecting unit.

11 Claims, 18 Drawing Sheets

AMPLIFYING APPARATUS

CROSS-REFERENCE TO RELATED APPLICATION

This application is a continuation application of a PCT international application No. PCT/JP2007/58659 filed on Apr. 20, 2007 in Japan, the entire contents of which are incorporated by reference.

FIELD

The embodiments discussed herein are related to an amplifying apparatus.

BACKGROUND

In recent years, a demand for reducing the size of the amplifier for a radio station has greatly arisen. Therefore, techniques of Doherty amplifying circuits and E-class amplifying circuits have been developed as high efficient circuit technologies.

(Doherty Amplifying Circuit)

A Doherty amplifying circuit (hereinafter simply called "Doherty circuit") is a high efficient circuit including two amplifiers called a main amplifier (also called carrier amplifier) 101 and a peak amplifier 102, ¼-wavelength (λ/4) transmission lines 103 and 104, as depicted in an example of FIG. 13.

Specifically, the Doherty amplifying circuit illustrated in FIG. 13 has a configuration in which the main amplifier 101 is coupled parallel to the peak amplifier 102 and the λ/4 transmission lines 103 and 104 are disposed at the input of the peak amplifier 102 and the output of the main amplifier 101, respectively.

Here, a typical parallel-coupling amplifying apparatus determines the bias conditions of the two amplifiers to be the same, but a Doherty circuit is desired to determine the bias conditions for two amplifiers 101 and 102 to be different from each other. In detail, the main amplifier 101 is set to be in the A-class or AB-class bias and the peak amplifier 102 is set to be in the B-class or C-class bias so as to have reduced bias electricity as compared to the main amplifier 101.

Consequently, when the level of an input signal is low, the peak amplifier 102 is in the off state for the above bias setting while the carrier amplifier 101 amplifies the input signal. When the level of an input signal increases to a certain value or more, the carrier amplifier 101 begins to become saturated, but the peak amplifier 102 turns to the on state, so that both the main amplifier 101 and the peak amplifier 102 operate such that the gain reduction caused by the saturation of the carrier amplifier 101 is compensated by the peak amplifier 102.

A Doherty circuit operates only the main amplifier 101 when the level of an input signal is low, and operates both amplifiers 101 and 102 when the level of the input signal is equal to or larger than a certain value (in other words, the peak amplifier 102 operates only when the level of an input signal is equal to or larger than a certain value), so that an operation with high efficiency can be ensured.

(E-Class Amplifying Circuit)

An E-Class Amplifying Circuit (Hereinafter simply called "E-class circuit") is a high efficient circuit in which a transistor functions as a switching device. Prior art of an E-class circuit is disclosed in for example, Non-Patent Document 1 below.

FIG. 14 illustrates an example of the configuration of an E-class amplifying circuit. The E-class amplifying circuit of FIG. 14 includes a switching device 201 such as a bipolar transistor or an field-effect transistor (FET), an input inductor 202 coupled parallel to the switching device 201, an LC resonant circuit including an output inductor 203 (having an inductance Ls+ΔL) coupled serially to the switching device 201 and a variable capacitor 204 (having a variable capacity Cm) coupled parallel to the output inductor 203, and a capacitor (shunt capacitor) 205 (having a capacity Cp) and load resistance 206 (having an impedance Z0) both coupled parallel to the switching device 201. The LC resonant circuit may have an output inductor and a capacitor serially connected to each other. The LC resonant circuit may have an output inductor and a capacitor serially connected to each other.

In the E-class amplifier having the above configuration, constants (circuit constants) Ls, ΔL, Cm, and Cp of circuit devices (passive devices) are determined based on an applied voltage Vds, a design frequency f0, and load impedance Z0 such that the conditions (switching conditions) for E-class operation are satisfied.

Under the on/off control over the switching device 201 in the E-class circuit, electricity flows into the switching device 201 while the switching device 201 is on and electricity flows into the shunt capacitor 205 while the switching device 201 is off.

As a result, the switching device 201 is to have a voltage waveform and an electricity waveform which do not temporally coincide with each other, thereby eliminating a loss at the switching device 201, so that the operation efficiency (direct current (DC)-alternating current (AC) conversion efficiency) can be improved.

Further, the LC resonant circuit coupled serially to the output end of the switching device 201 removes high-frequency electricity generated in the circuit, so that only the basic wave can be amplified.

Examples of a high-efficient amplifying circuit known to the public are disclosed in the below Patent Documents 1 to 3 and Non-Patent Document 1.

The technique of Patent Document 1 relates to a linear power amplifier, particularly to a microwave power amplifier for a signal having multiple carrier frequencies. There has been provided a power amplifier which linearly amplifies a multiple-carrier signal in a noise shape at a wide power level. In addition, the Document aims at providing an amplifier and a method of amplifying, with low loss (i.e., preferable DC/RF efficiency), which attains a high DC/RF conversion efficiency at a wide range of the level of an input driving signal. For the above, the Patent Document 1 discloses a configuration in which a number of biased amplifiers networks are coupled into multiple stages so as to respond when the efficiency of a former state amplifier declines.

The technique disclosed in Patent Document 2 relates to a high-efficient integrated power amplifier capable of tuning. Possession of a high Q value is realized over the range adjusted by controlling reactive device (e.g. inductors and capacitors) constituting a power amplifier (E-class amplifier) through the use of a control signal, so that a high-quality output can be generated which is low in high-frequency component and responsive to frequency over a wide frequency range of an input signal.

The technique disclosed in Patent Document 3 aims at providing a high efficient amplifier having two amplifier units whose output-end impedances property match. For the above, impedance convertors are provided so as to be coupled to the output ends of the respective amplifier units through a matching circuit, and a combiner, which couples to the output ends of both impedance convertors and inputs and combines amplified outputs of each of the amplifying units, is provided.

According to this circuit configuration, the amplifier units can successfully attain designed impedance values without depending on the operation states of the respective amplifier units.

[Patent Document 1] Japanese Translation of PCT international application No. 2001-502493

[Patent Document 2] Japanese Translation of PCT international application No. 2003-504906

[Patent Document 3] Japanese Laid-Open Patent Publication No. 2003-188651

[Non-Patent Document 1] S. C. Cripps, "RF Power Amplifiers for Wireless Communication. Norwood", MA: Artech House, 1999, pp. 145-178

The operation in the Doherty circuit varies with an output power (output level).

In detail, providing that the characteristic impedance of the $\lambda/4$ transmission line 104 is R0 (=50 Ohms) and the output load of the Doherty circuit is R0/2, only the main amplifier (Carrier Amplifier) 101 operates but the peak amplifier 102 is not activated during a low-output operation when the level of the input signal is low. As a result, as schematically depicted in FIG. 15, the output impedance of the peak amplifier 102 is (ideally) the open state and the output impedance of the main amplifier 101 is apparently 2R0=100 Ohms, which is obtained through impedance conversion over the output load R0/2, because the characteristic impedance of the $\lambda/4$ transmission line 104 is R0.

In contrast, during a high-output operation when the level of the input signal is high, the peak amplifier 102 is operating along with the main amplifier 101, so that, as schematically depicted in FIG. 16, both amplifiers 101 and 102 apparently have loaded impedances of R0=50 Ohms. At this time, since the characteristic impedance of the $\lambda/4$ transmission line 104 is also R0, the $\lambda/4$ transmission line 104 does not carry out impedance conversion (i.e., R0 is in the matching state) and therefore the output impedance of the carrier amplifier 101 is R0=50 Ohms.

Here, assuming that a Doherty circuit adapting a high-efficiency circuit technique is combined with an E-class circuit, that is, E-class amplifiers are applied to the two amplifiers 101 and 102, designed values (optimum values) of the circuit constants Ls, Cm, vary (see FIG. 17) because the output load (load impedance Z0) is regarded as one of the design parameters in an E-class circuit and therefore variation of the output impedance (i.e., the output impedance of a Doherty circuit) varies the load impedance Z0 in conformity with the level of an input signal. However, FIG. 17 assumes that Cp and $\Delta$L vary little in the load impedance range between 50 through 100 Ohms.

Consequently, when the load impedance Z0 is a fixed value, the variation of the load impedance from the Doherty circuit causes the amplification efficiency to be lower, as depicted in FIG. 18.

SUMMARY (1) According to an aspect of the embodiment, an apparatus includes an amplifying apparatus including: a Doherty amplifying circuit including a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power equal to or larger than a specified value, to amplify the input signal; a combining unit which combines outputs from the first amplifier and the second amplifier; power detecting unit which detects an output power from the combining unit; and controlling unit which controls at least the first circuit constant in accordance with the output power detected by the power detecting unit such that an amplifying efficiency of the Doherty amplifying circuit is not reduced.

(2) According to an aspect of the embodiment, an apparatus includes an amplifying apparatus including: a Doherty amplifying circuit including a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power larger than a specified value, to amplify the input signal; a combining unit which combines outputs from the first amplifier and the second amplifier; power detecting unit which detects an output power from the first amplifier; and controlling unit which controls at least the first circuit constant in accordance with the output power detected by the power detecting unit such that an amplifying efficiency of the Doherty amplifying circuit is not reduced.

(3) According to an aspect of the embodiment, an apparatus includes an amplifying apparatus including: a Doherty amplifying circuit including a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power larger equal to or than a specified value, to amplify the input signal; a combining unit which combines outputs from the first amplifier and the second amplifier; first power detecting unit which detects a first output power from the first amplifier; second power detecting unit which detects a second output power from the second amplifier; and first controlling unit which controls the first circuit constant in accordance with the first output power detected by the first power detecting unit such that an amplifying efficiency of the Doherty amplifying circuit is not reduced; and second controlling unit which controls the second circuit constant in accordance with the second output power detected by the second power detecting unit such that an amplifying efficiency of the Doherty amplifying circuit is not reduced.

(4) According to an aspect of the embodiment, an apparatus includes a method for controlling a Doherty amplifying circuit including a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power equal to or larger than a specified value, to amplify the input signal, said method including: coupling outputs from the first amplifier and the second amplifier; detecting an output power obtained by the coupling; and controlling at least the first circuit constant in accordance with the output power detected such that an amplifying efficiency of the Doherty amplifying circuit is not reduced.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Hereinafter, various embodiments will be described with reference to the accompanying drawings. However, it should be noted that the embodiments explained below are only examples to aid the understanding of the gist of the embodiments and that there is no intention to exclude the various modifications and the application of another techniques that are not clarified in the following embodiments. Therefore, individual embodiments can be modified (for example combined with one another).

[1] Principle

Figure 1:
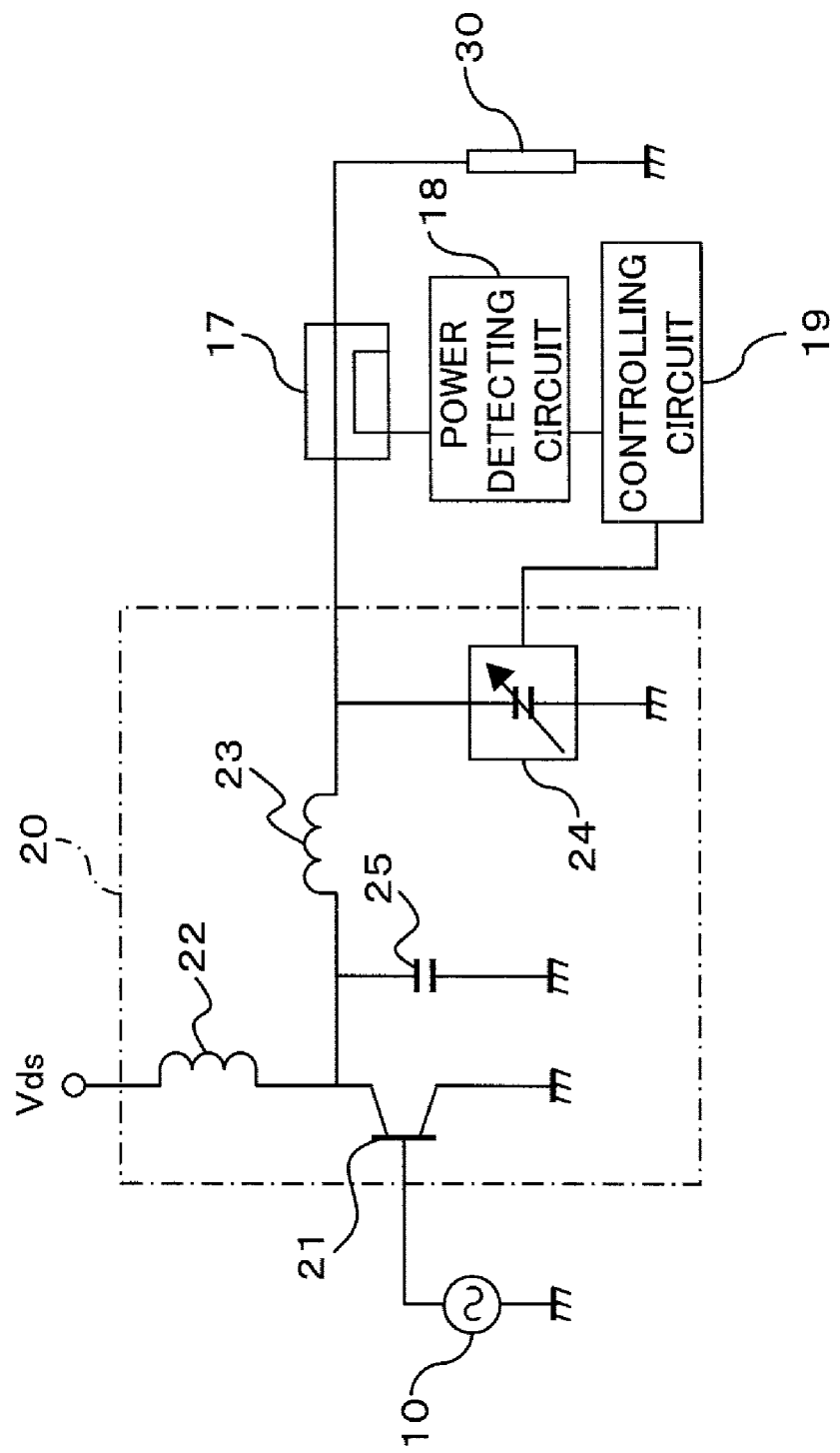
FIG. 1 is a block diagram denoting the configuration of an amplifying apparatus (E-class amplifier) for description of the principle.

FIG. 1 is a block diagram denoting the configuration of an amplifying apparatus (E-class amplifier) for description of the principle. The amplifying apparatus (hereinafter, also called an amplifying circuit) illustrated in FIG. 1 includes, as the basic configuration of an E-class amplifier 20, a switching device 21 such as a bipolar transistor or an field-effect transistor (FET), an input inductor 22 coupled parallel to the switching device 21, an LC resonant circuit including an output inductor 23 (having an impedance value Ls+ΔL) coupled serially to the switching device 21 and a variable capacitor 24 (having a variable capacity Cv) coupled parallel to the output inductor 23, and a capacitor (shunt capacitor) 25 (having a capacity Cp) coupled parallel to the switching device 21. The LC resonant circuit may have an output inductor and a capacitor serially connected to each other.

The amplifying circuit illustrated in FIG. 1 additionally includes load resistance 30 (having an impedance value Z0) coupled parallel to the switching device 21, a coupler (directional coupler) 17 disposed between the output inductor 23 and the load resistance 30, a power detecting circuit 18, and the controlling circuit 19. The reference number 10 represents the source of input signals to be amplified.

Also in the first embodiment, the E-class amplifier 20 determines constants (circuit constants) Ls, ΔL, Cv, and Cp of circuit devices (passive devices) based on an applied voltage Vds, a design frequency f0, load impedance value Z0 such that the conditions for E-class operation are satisfied.

Here, the directional coupler 17 branches a part of an output signal from the E-class amplifier 20 (the output inductor 23) which part is destined for the power detecting circuit 18. The power detecting circuit 18 detects an output power through detecting an output signal branched by the directional coupler 17, and therefore functions, in conjunction with the directional coupler 17, as power detecting means.

The controlling circuit (controlling means) 19 variably controls the capacity Cv of the variable capacitor 24, which capacity is one of the circuit constants, based on the output power detected by the power detecting circuit 18.

In the E-class amplifying circuit (hereinafter also called "E-class circuit") of the illustrated example having the above configuration, the power detecting circuit 18 detects an output power of the E-class amplifier 20; the controlling circuit 19 controls the capacity Cv of the variable capacitor 24 in accordance with the result of the detection, so that the amplification efficient can be made as good as possible (i.e., can be optimized) at any output power as denoted in, for example, FIG. 2.

Figure 2:
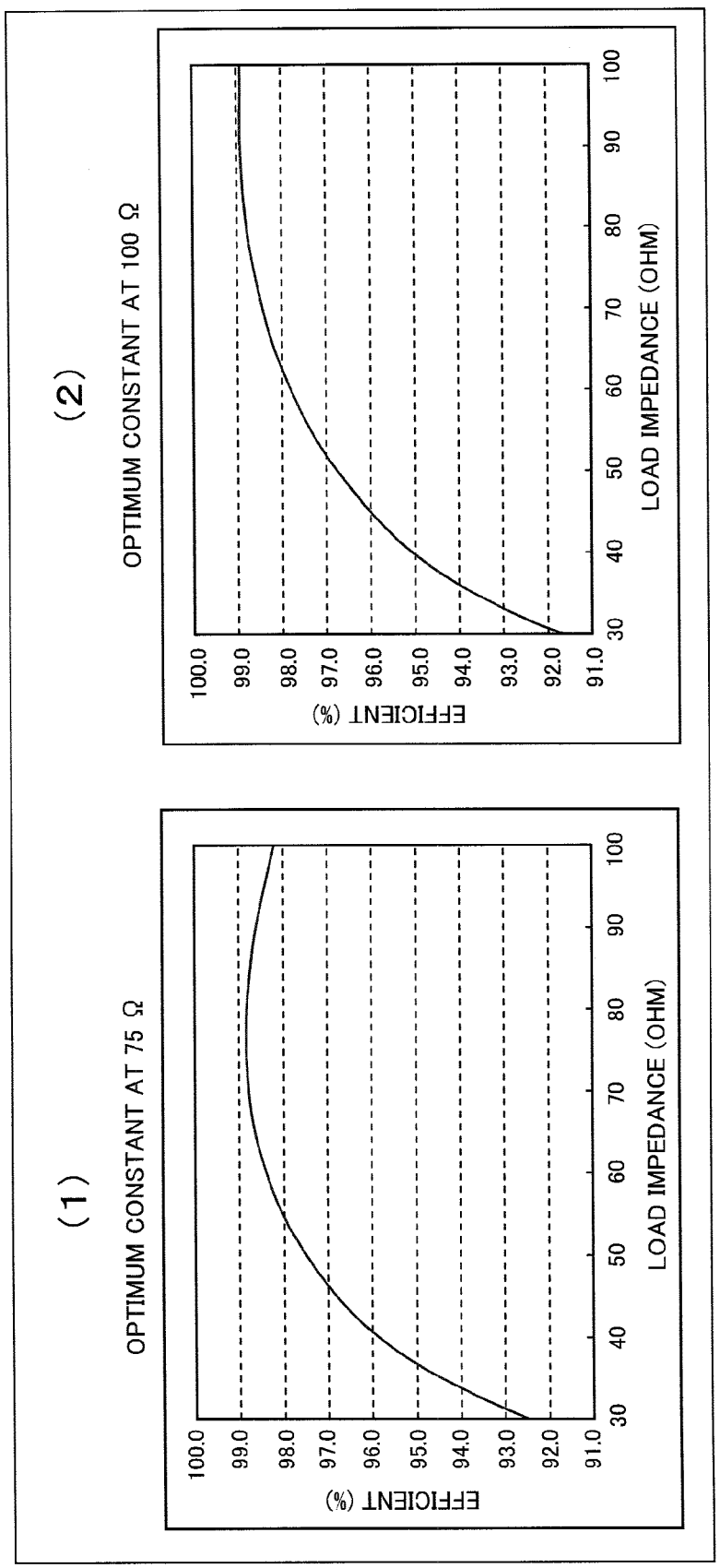
FIG. 2 is a graph denoting an example of an amplifying efficiency of an E-class amplifier of FIG. 1 relative to load impedance.

FIG. 2(1) and FIG. 2(2) are examples of graphs of an amplification efficiency relative to load impedance in the cases where the circuit constant (capacity Cv) is controlled (optimized) such that the amplification efficiency becomes the best when the output (load) impedances from the E-class circuit are about 75 Ohms and 100 Ohms, respectively.

Figure 15:
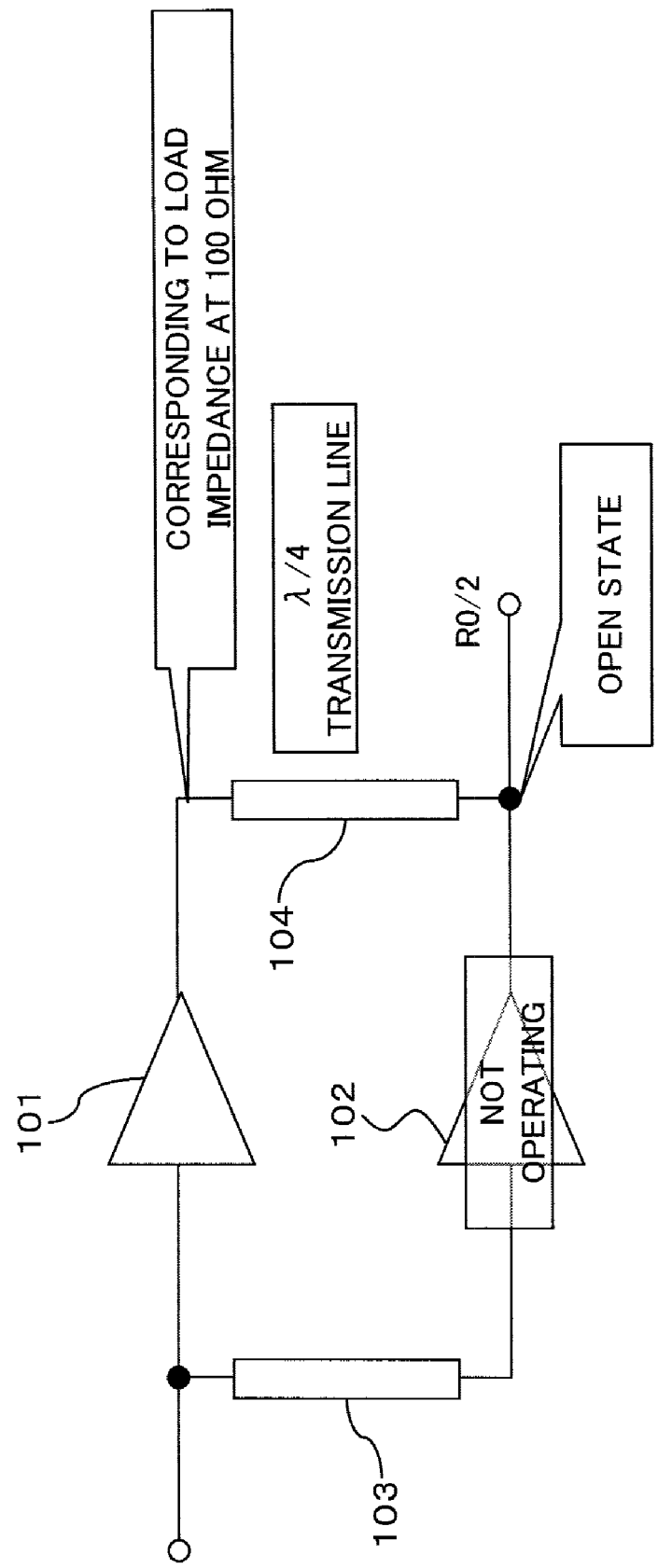
FIG. 15 is a diagram explaining the operation of the Doherty circuit of FIG. 13.
Figure 16:
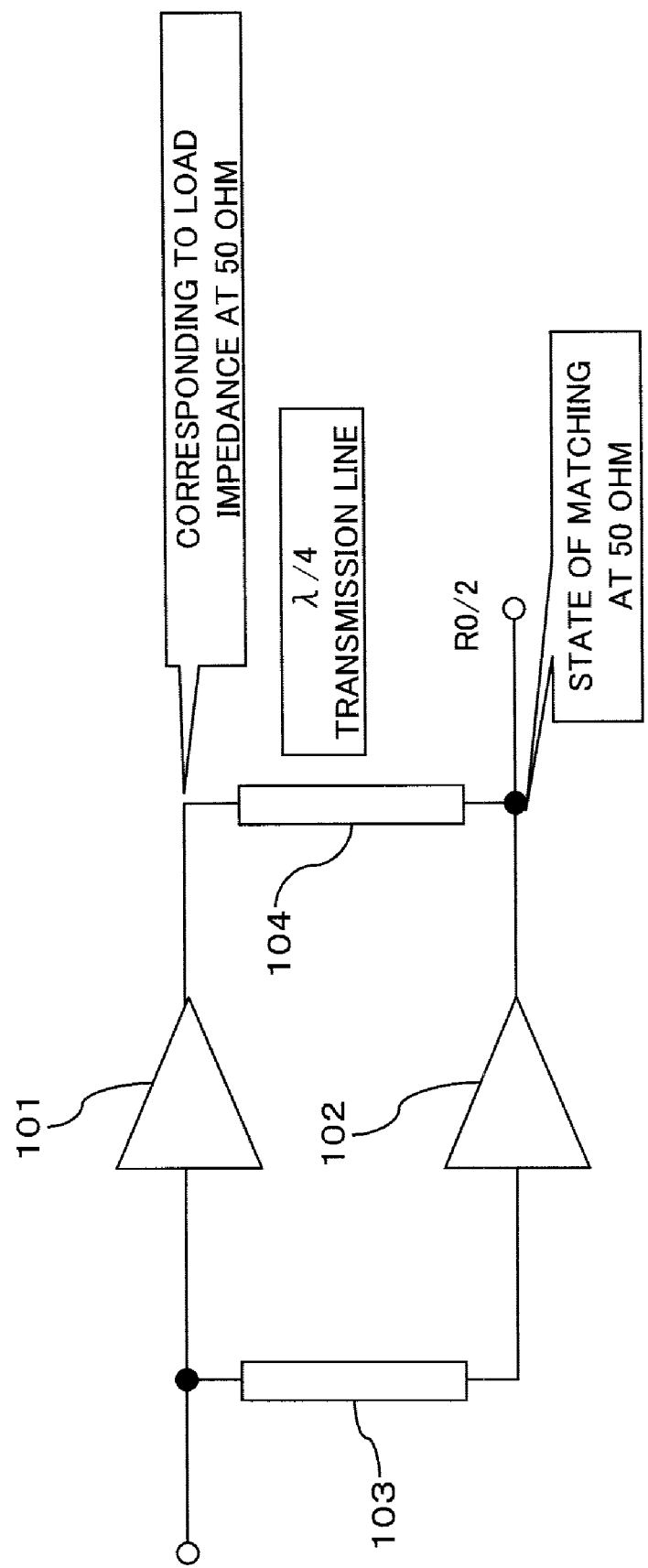
FIG. 16 is a diagram explaining the operation of the Doherty circuit of FIG. 13.

Accordingly, in application of E-class circuits to a Doherty circuit (carrier amplifier and peak amplifier), even when an output impedance from Doherty circuit varies with the level of an input signal as explained with reference to FIGS. 15 and 16, the presence of such a controlling system makes it possible to control (optimize) the circuit constant (capacity Cv) in accordance with the fluctuation, so that decline in amplification efficiency can be inhibited.

Figure 17:
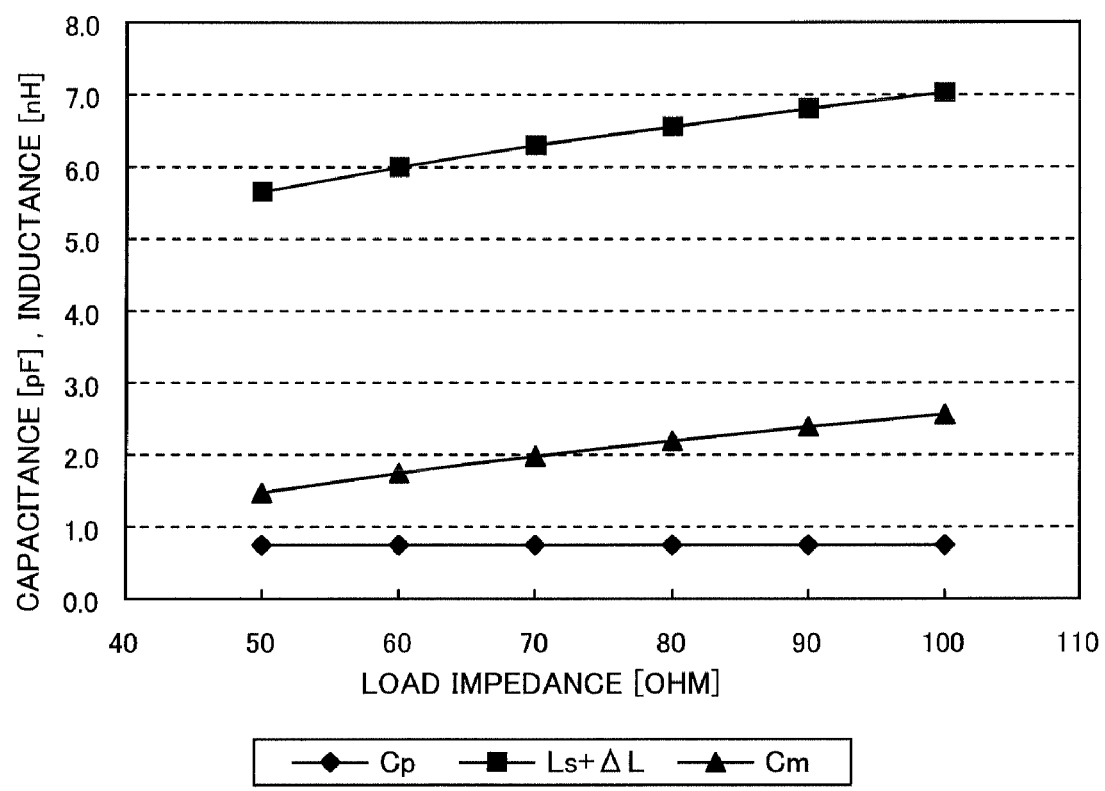
FIG. 17 is a graph denoting designed values (logical calculation values) of parameters (circuit constants) of the E-class circuit of FIG. 14.
Figure 18:
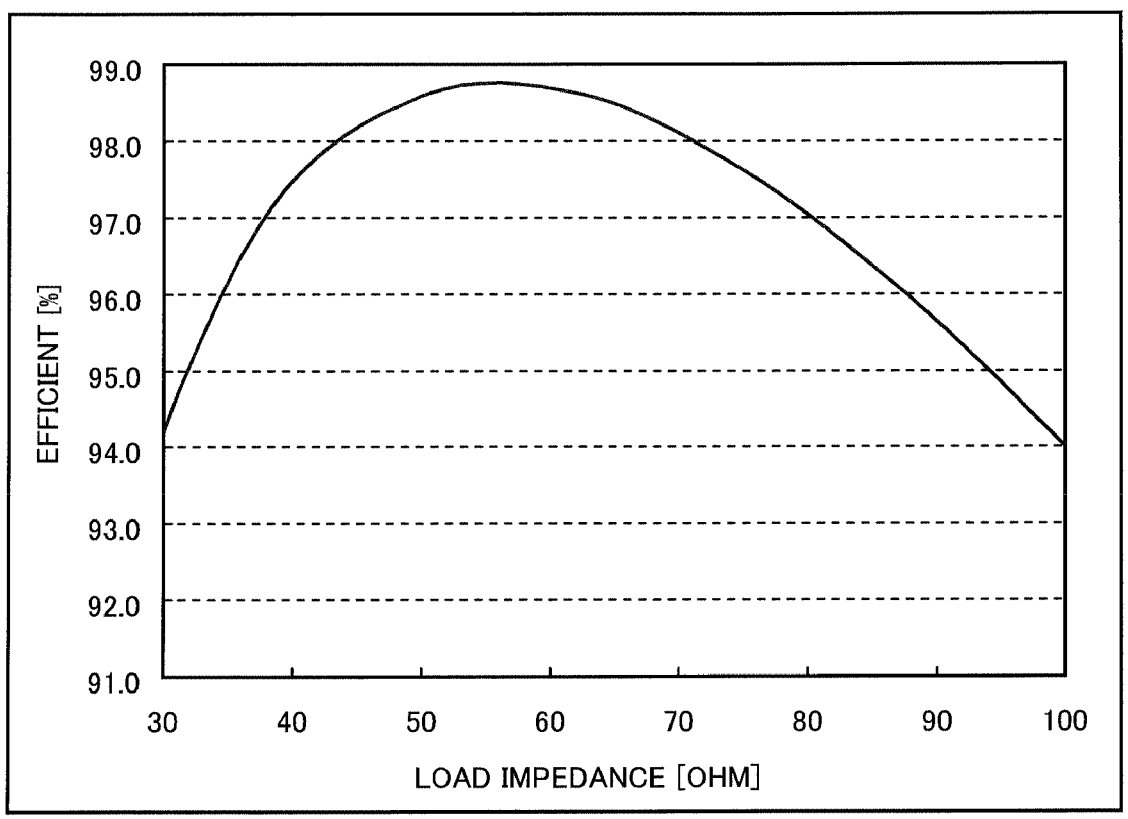
FIG. 18 is a graph denoting an amplifying efficiency of the E-class circuit of FIG. 14 relative to load impedance.

For example, as depicted in FIG. 17, the optimum value (logical calculation value) of the capacity of the variable capacitor 24 of the E-class circuit tends to increase proportionally to an increase of the output impedance from the E-class circuit. Therefore, the optimum capacity of the variable capacitor 24 tends to decrease in accordance with a decrease, which is caused by a decrease of an output impedance from the carrier amplifier 11 serving as an E-class circuit since the peak amplifier has been activated, of an output impedance from the Doherty circuit.

Accordingly, controlling the capacity Cv of the variable capacitor 24 to decrease in accordance with a decrease of the output impedance from the Doherty circuit (or the carrier amplifier) can inhibit decline of the amplification efficiency. Here, although the circuit constant (inductance Ls+ΔL) of the output inductor 23 is one of the design parameters as denoted in FIG. 17, variable control only over the capacity of the variable capacitor 24 can sufficiently improve the amplification efficiency. In this regard, when the output inductor 23 can be configured to be a variable inductor capable of varying the inductance thereof, the improvement in amplification efficient can be achieved by controlling the inductance of the variable inductor individually or in combination with controlling over the capacitor 24, which is common to the following embodiments.

[2] First Embodiment

Figure 3:
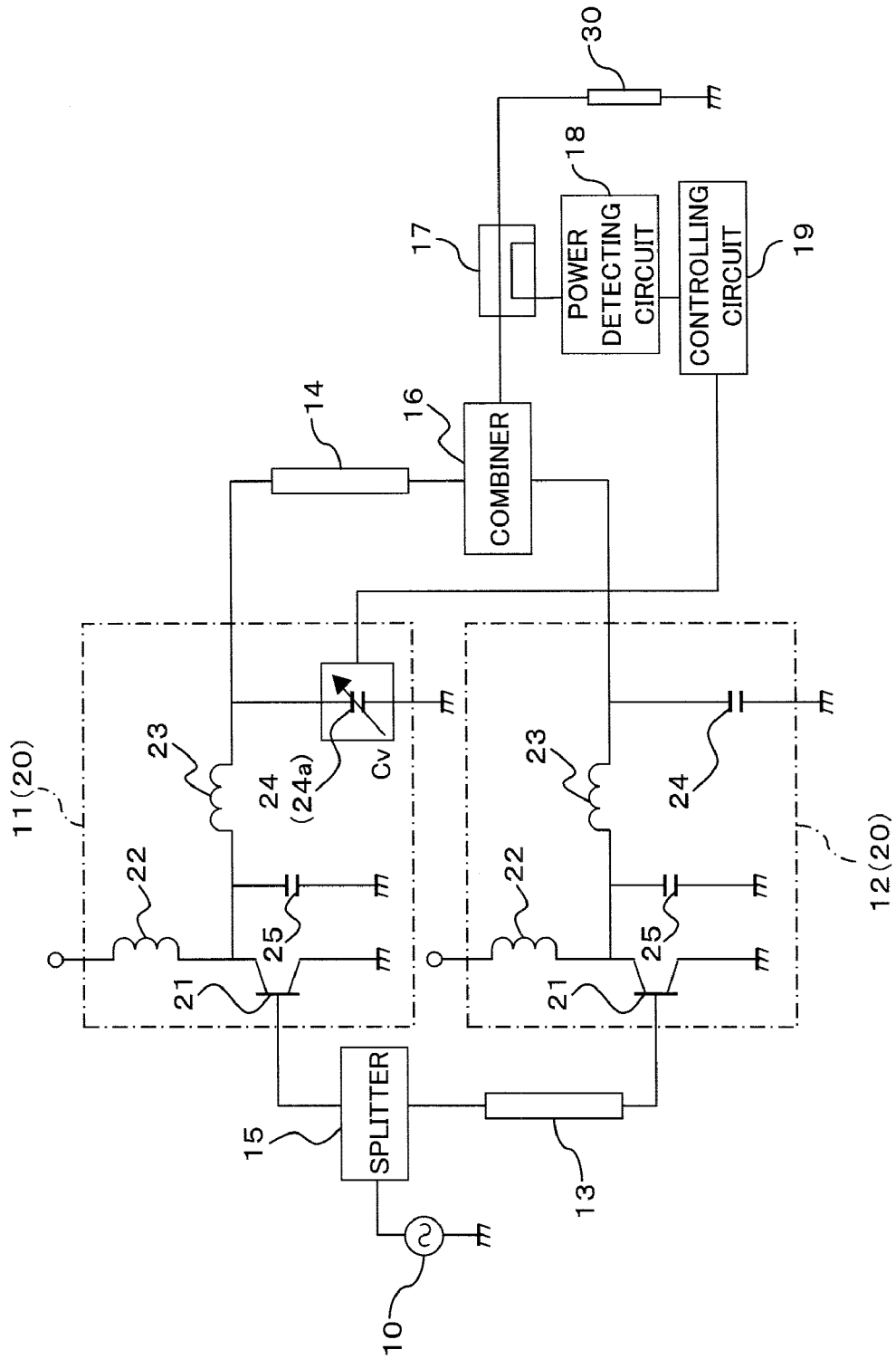
FIG. 3 is a block diagram illustrating the configuration of a Doherty circuit to which E-class amplifiers of a first embodiment are applied.

FIG. 3 is a block diagram illustrating the configuration of a Doherty circuit to which the above E-class circuits are applied. The Doherty circuit of FIG. 3 includes: a splitter 15 which branches an input signal from the input signal source 10 into two identical signals; a carrier amplifier 11 that amplifies one of the output signals from the splitter 15; a ¼ wavelength (λ/4) transmission line 14 which shifts (delays) the phase of the output signal from the carrier amplifier by π/4 and outputs the phase-shifted signal; a ¼ wavelength (λ/4) transmission line 13 which shifts (delays) the phase of the other output signal from the splitter 15 by π/4 and outputs the phase-shifted signal; a peak amplifier 12 which amplifies the signal having passed through the λ/4 transmission line 13; a combiner 16 which combines the output from the carrier amplifier 11 and having passed through the λ/4 transmission line 14 and the output signal from the peak amplifier 12; load resistance (output load) 30 disposed at the output end of the combiner 16; a directional coupler (coupler) 17 disposed between the combiner 16 and the load resistance 30; a power detecting circuit 18 which inputs therein the output from the directional coupler 17; and a controlling circuit 19 which inputs therein the output from the power detecting circuit 18. To each of the amplifiers 11 and 12, the basic circuit configuration of the E-class amplifier 20 illustrated in FIG. 1 is applied.

In detail, each of the amplifiers 11 and 12 includes a switching device 21 such as a bipolar transistor or an field-effect transistor (FET), an input inductor 22 coupled parallel to the switching device 21, an LC resonant circuit including an output inductor 23 coupled serially to the switching device 21 and a variable capacitor 24 coupled parallel to the output inductor 23, and a capacitor (shunt capacitor) 25 coupled parallel to the switching device 21. The carrier amplifier 11 and the peak amplifier 12 respectively function as a first E-class amplifier and a second E-class amplifier.

Also in the first embodiment, the constants (circuit constant) of the circuit devices (passive devices), such as the output inductor 23, the variable capacitor 24, and the load resistance 30, are determined such that the amplifiers 11 and 12 satisfy the specified conditions (switching conditions) for E-class operation. In other words, the carrier amplifier 11 has a first circuit constant which is determined so as to satisfy conditions for E-class operation, and the peak amplifier 12 has a second circuit constant which is determined so as to satisfy conditions for E-class operation.

It should be noted that, in the first embodiment, at least the variable capacitor 24 of the carrier amplifier 11 is configured to be a variable capacitor 24a (having a variable capacity Cv), the capacity Cv of which can be varied under the control of the controlling circuit 19.

Here, the coupler 17 branches a part of an output signal from the combiner 16, that is, an output signal from the Doherty circuit (hereinafter, sometimes abbreviated to a "Doherty output") and outputs the branched signal to the power detecting circuit 18, which detects the output power from the Doherty circuit through detecting the Doherty output from the coupler 17. The power detecting circuit 18 functions, in conjunction with the coupler 17, as power detecting means which detects a Doherty output power.

The controlling circuit (controlling means) 19 controls the capacity Cv of the variable capacitor 24a of the carrier amplifier 11 in accordance with the Doherty output power detected by the power detecting circuit 18. The first embodiment regards a Doherty output power that activates the peak amplifier 12 (to amplify) in accordance with an increase in level of an input signal as the power threshold. As depicted in the example of FIG. 5, the capacity Cv of the variable capacitor 24a is controlled to decrease in accordance with an increase of the power detected by the power detecting circuit 18 (hereinafter called detected power) when the detected power is equal to or lager than the power threshold while the detected power is except for the above (i.e., the detected power is less than the power threshold), the capacity Cv of the variable capacitor 24a is controlled to be constant.

Figure 4:
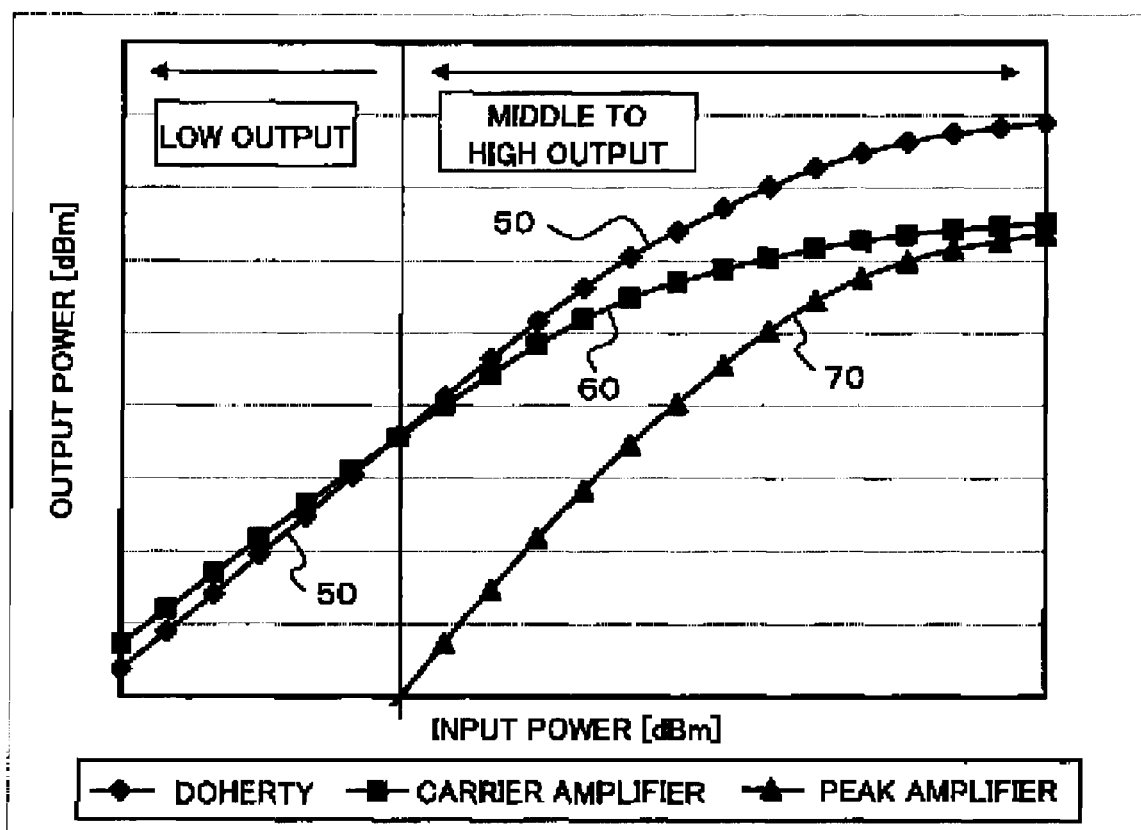
FIG. 4 is a diagram denoting input and output characteristics of a Doherty circuit (carrier amplifier, peak amplifier) of FIG. 3.
Figure 5:
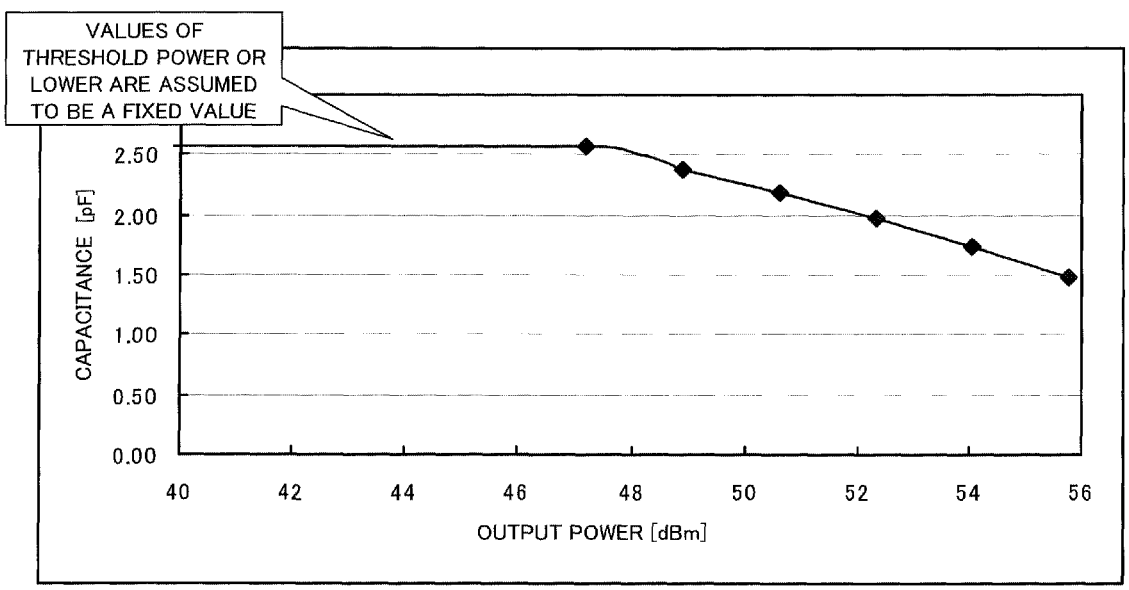
FIG. 5 is a diagram denoting an example of control data to be used in a controlling circuit of the Doherty circuit of FIG. 3.

Such control is realized by, for example, storing data (control data) representing a capacity Cv relative to a detected power as depicted in FIG. 5, which data is in the form of a table, into a non-illustrated memory. The control data is determined based on the parameter design value (logical calculated value) of FIG. 17 and the input/output characteristics of the Doherty circuit (amplifiers 11 and 12) of FIG. 4.

Hereinafter, description will be made in relation to the Doherty circuit having the above configuration according to the first embodiment.

Specifically, during a low-output operation in which the level of an input signal from the input signal source 10 is less than the a specified value (that is, the detected power is less than the power threshold) only the carrier amplifier 11 is operating and therefore the peak amplifier 12 is not activated, so that the Doherty output (i.e., the output from the combiner 16) behaves substantially the same as the amplification characteristics 60 of the single carrier amplifier 11 as denoted by the reference number 50 in FIG. 4, for example.

In contrast, during a middle to high output operation in which the level of the input signal is equal to or larger than the specified value (that is, the detected power is equal to or larger than the power threshold), the peak amplifier 12 (sic) is operating as well as the carrier amplifier 11 (sic) and the combiner 16 therefore combines the amplified output from the peak amplifier 12 with that from the carrier amplifier 11 at the same phase. Consequently, even at the level of an input signal which prompts the amplification characteristics 60 of the signal carrier amplifier 11 to become saturated, the amplification characteristics 70 of the peak amplifier 12 can compensate the gain reduction caused by the saturation.

Then, the controlling circuit 19 derives the optimum capacity Cv corresponding to the Doherty output power detected by the power detecting circuit 18 from the control data denoted in FIG. 5 and controls the variable capacitor 24a to have the derived optimum capacity Cv.

Specifically, in a region in which the power (hereinafter called detected power) detected by the power detecting circuit 18 is equal to or larger than a power threshold identical to the Doherty output power at which the peak amplifier 12 is activated (to amplify) in accordance with an increase in level of the input signal, the capacity of the variable capacitor 24a is controlled to decrease in accordance with an increase of the detected power. In the region except for the above (i.e., the detected power is less than the power threshold), the capacity Cv of the variable capacitor 24a is controlled to be constant.

With this configuration, even when an output impedance of the carrier amplifier 11 varies with the level of the input signal, resulting in fluctuation of the Doherty output, the circuit constant (capacity Cv) is automatically determined in accordance with the fluctuation so as to optimize the amplification efficiency. As a result, it is possible to inhibit lowering in amplification efficiency of the Doherty circuit when the input signal is at any level.

[3] Second Embodiment

The configuration of the first embodiment disposes the coupler 17 at the output end of the combiner 16, so that the capacity Cv of the variable capacitor 24a is controlled based on the Doherty output power. The same effect as the first embodiment can be obtained by the configuration illustrated in FIG. 6 in which: the coupler 17 is disposed in the output end of the carrier amplifier 11 (i.e., the input end of the λ/4 transmission line 14); the power detecting circuit 18 detects an output power from the carrier amplifier 11; and the controlling circuit 19 controls the capacity Cv of the variable capacitor 24a based on the result of the detection.

In addition, since the output of the carrier amplifier 11 is lower in detection power than the Doherty output, the second embodiment has advantages of flexibility in selection parts of and reduction in area desired for the fabrication of the power detecting circuit 18 and controlling circuit 19 as compared with the first embodiment.

Figure 7:
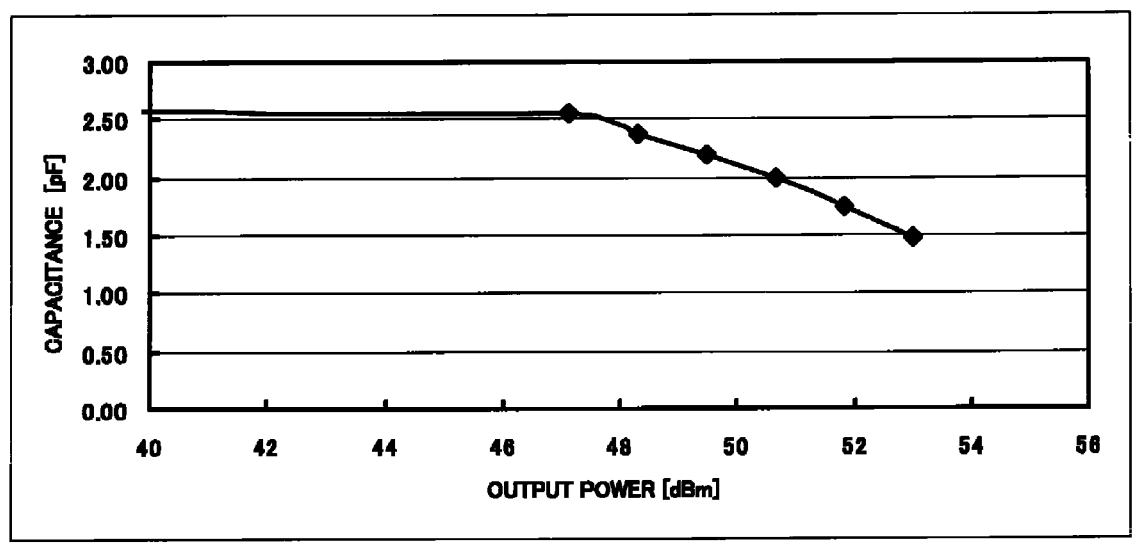
FIG. 7 is a diagram denoting an example of control data to be used in a controlling circuit of the Doherty circuit of FIG. 6.

As substitute for the control data denoted in FIG. 5, the second embodiment sufficiently stores data (control data), in the form of a table into a non-illustrated memory, representing the capacity Cv of the variable capacitor 24a relative to the output power of the carrier amplifier 11 as denoted in FIG. 7.

[4] Third Embodiment

Figure 8:
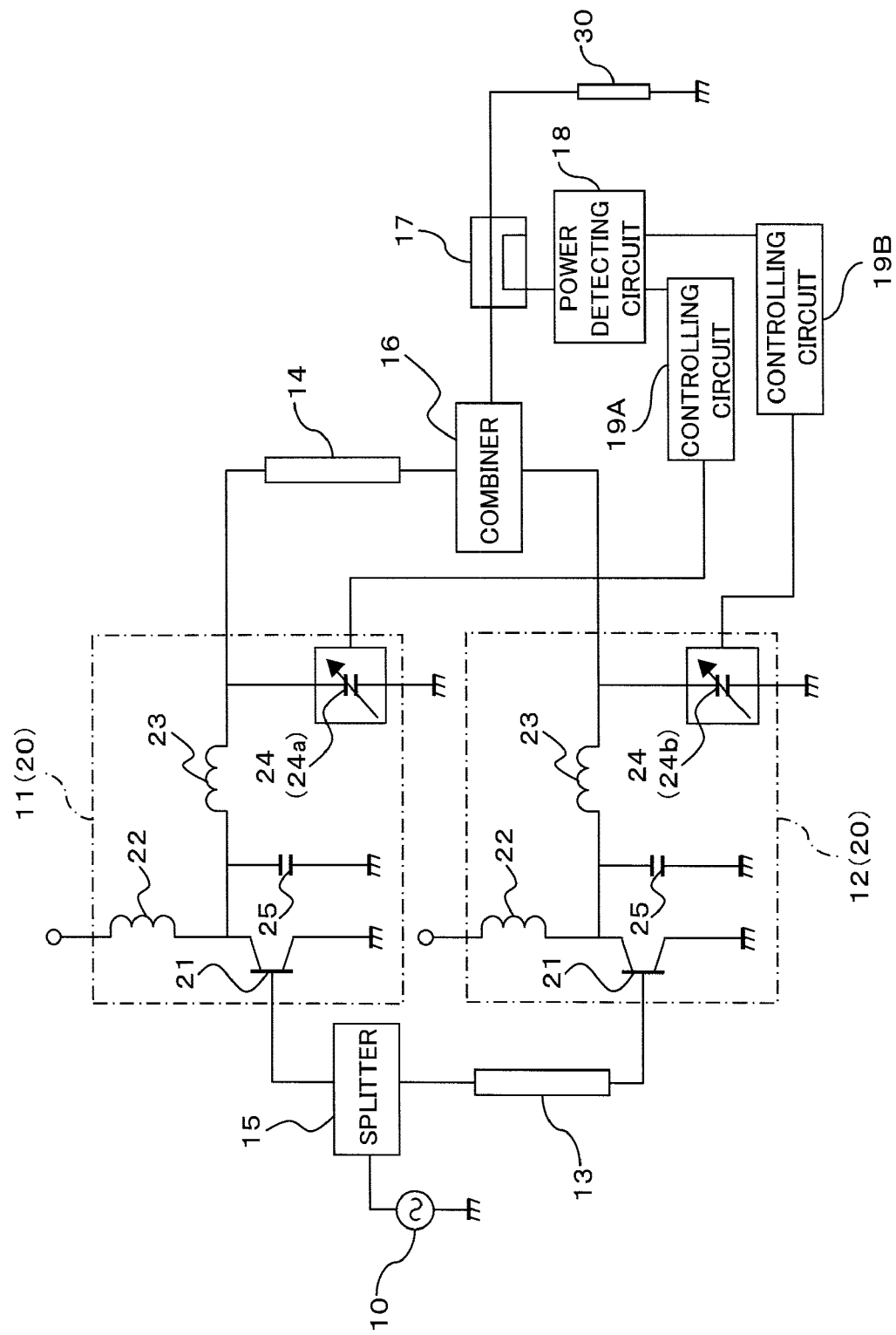
FIG. 8 is a block diagram illustrating the configuration of Doherty circuit to which E-class amplifiers of a third embodiment are applied.

FIG. 8 is a block diagram illustrating a Doherty circuit to which E-class circuits are applied according to the third embodiment. The Doherty circuit depicted in FIG. 8 is different from the circuit configuration of FIG. 1 in the points that the capacitor 24 of the peak amplifier 12 is also a variable capacitor 24b and controlling circuits 19A and 19B are provided in association with the variable capacitors 24a and 24b, respectively.

In other words, the Doherty circuit of the third embodiment can control the capacities of the variable capacitors 24a and 24b, serving as circuit constants of the respective amplifier 11 and 12, independently of each other through the use of the controlling circuit 19A and 19B, respectively. Parts and elements having same reference numbers explained above represent identical or substantially identical parts and elements (throughout the embodiments below) unless otherwise specified.

The configuration of the first embodiment sufficiently improves the amplification efficiency through the control only over the capacitor 24a of the carrier amplifier 11. However, since the load impedance of the peak amplifier 12 slightly varies when the combiner 16 (a point at which same-phase combination is carried out) is not isolated, the configuration of the third embodiment aims at eliminating a factor of lowering the amplification efficiency caused by the variation through the control (correction) by the other controlling circuit 19B.

Accordingly, the controlling circuit 19B of the illustrated embodiment sufficiently stores data obtained by correcting control data denoted in FIG. 5 in accordance with the variation in a non-illustrated memory of others. The controlling circuit 19A operates the same as the first embodiment.

[5] Fourth Embodiment

Figure 9:
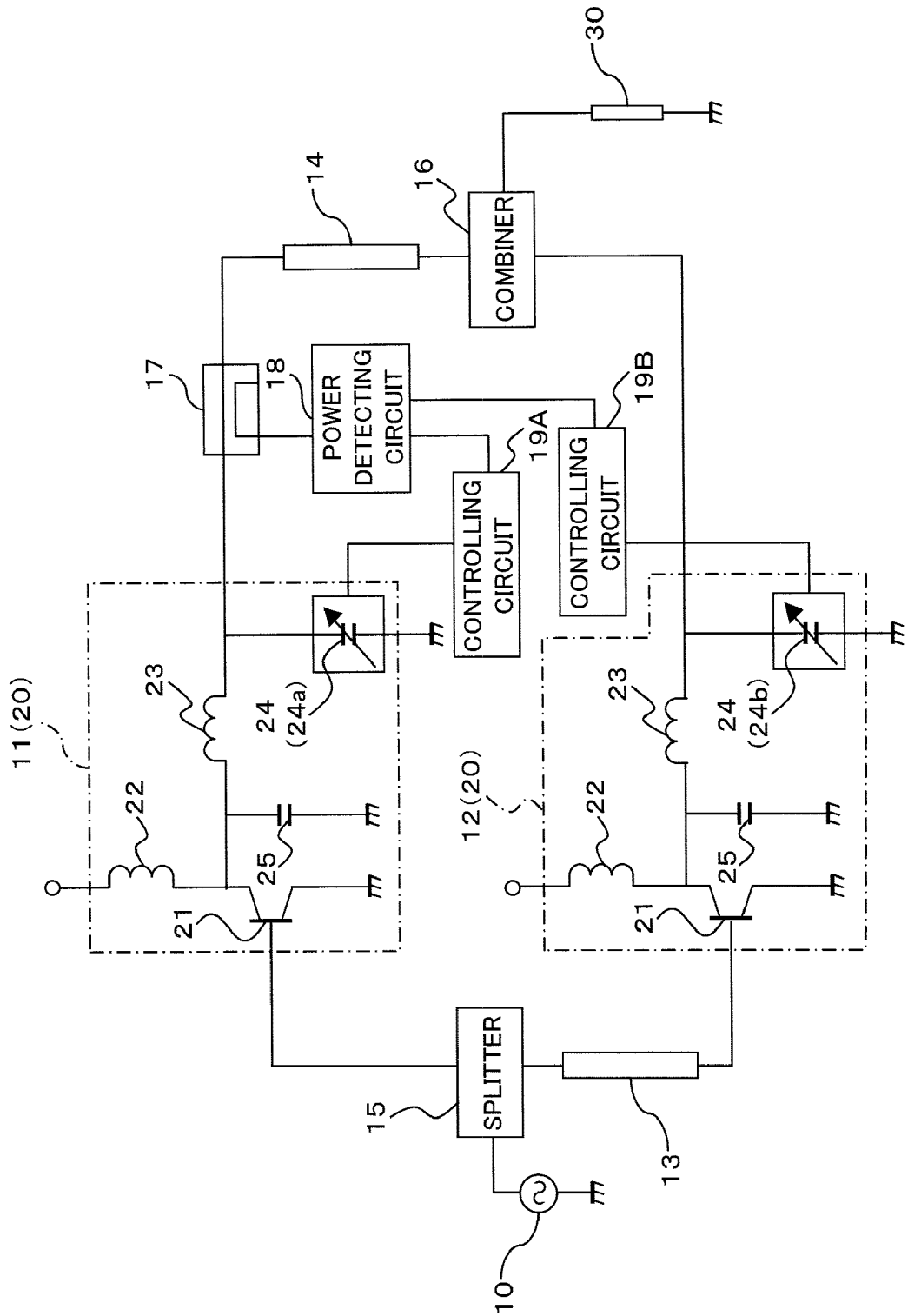
FIG. 9 is a block diagram illustrating the configuration of Doherty circuit to which E-class amplifiers of a fourth embodiment are applied.

Similarly to the second embodiment, as depicted in the example of FIG. 9, the third embodiment can have a configuration in which the coupler 17 depicted in FIG. 8 is disposed at the output end of the carrier amplifier 11 (i.e., the input end of the λ/4 transmission line 14); the power detecting circuit 18 detects an output power from the carrier amplifier 11; and capacities of the variable capacitors 24a and 24b of each of the amplifier 11 and 12 are independently controlled respectively by the controlling circuits 19A and 19B in accordance with the result of the detection. The illustrated configuration can obtain the same effects of the third embodiment.

[6] Fifth Embodiment

Figure 10:
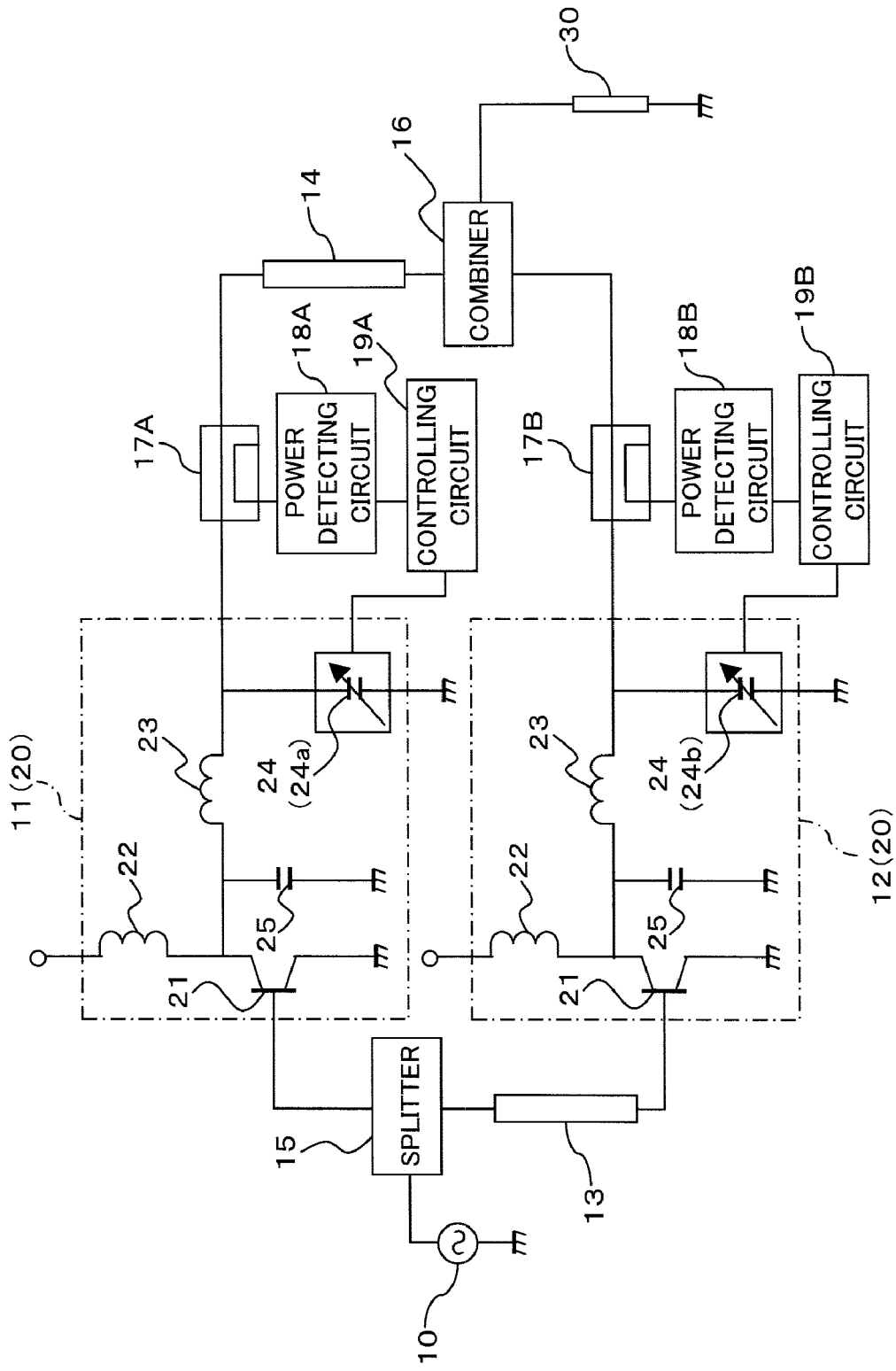
FIG. 10 is a block diagram illustrating the configuration of Doherty circuit to which E-class amplifiers of a fifth embodiment are applied.

FIG. 10 is a block diagram illustrating a Doherty circuit to which E-class circuits are applied according to the fifth embodiment. The Doherty circuit of FIG. 10 further includes, in addition to the controlling circuits 19A and 19B, couplers 17A and 17B and power detecting circuits 18A and 18B separately for the carrier amplifier 11 and the 12 as substitutes for the coupler 17 and the power detecting circuit 18 of the circuit configuration depicted in FIG. 9. In other words, the Doherty circuit of FIG. 10 has control units for each of the amplifiers 11 and 12 independently of each other.

Specifically, the coupler (first directional coupler) 17A branches a part of an output signal from the carrier amplifier 11 to be destined for the power detecting circuit 18A, which detects a power through the detection of the signal (carrier amplifier output) input from the coupler 17A. The power detecting circuit 18A functions, in conjunction with the coupler 17A, as first power detecting means which detects output power of the carrier amplifier.

The other coupler (second directional coupler) 17B branches a part of an output signal from the peak amplifier 12 to be destined for the power detecting circuit 18B, which detects a power through the detection of the signal (peak amplifier output) input from the coupler 17B. The power detecting circuit 18B functions, in conjunction with the coupler 17B, as second power detecting means which detects output power of the peak amplifier.

The controlling circuit (first controlling means) 19A stores, similarly to the controlling circuit 19 of the first embodiment, control data depicted in FIG. 5 into a non-illustrated memory or the others, and controls the capacity of the variable capacitor 24a of the carrier amplifier 11 based on the power detected by the power detecting circuit 18A and the control data.

Figure 11:
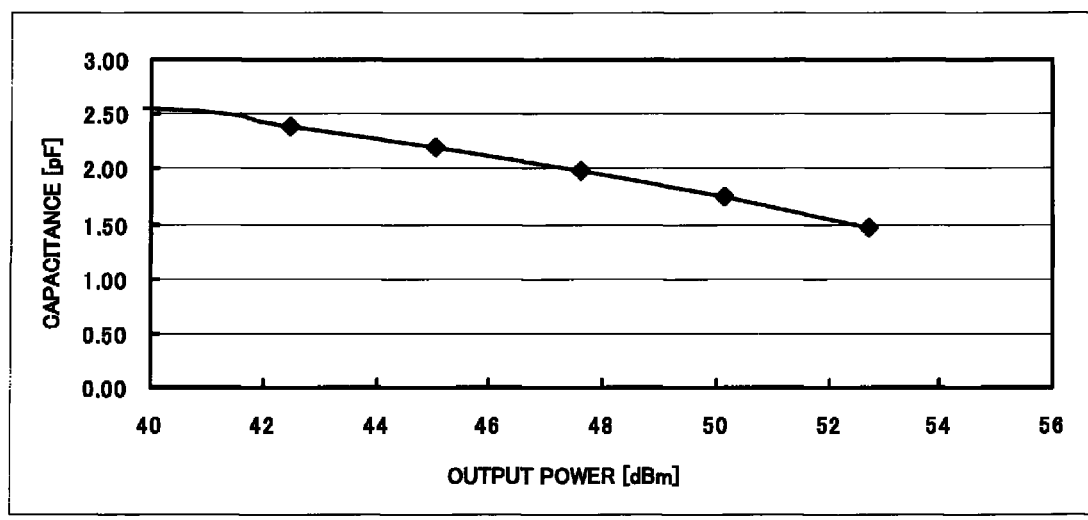
FIG. 11 is a diagram denoting an example of control data to be used in a controlling circuit of the Doherty circuit of FIG. 10.

On the other hand, the other controlling circuit (second controlling means) 19B stores control data depicted in FIG. 11 in a non-illustrated memory and controls the capacity of the variable capacitor 24b of the peak amplifier 12 based on the power detected by the power detecting circuit 18B and the control data. In detail, the controlling circuit 19B controls the capacity of the variable capacitor 24b to decrease in accordance with an increase of the output impedance from the peak amplifier 12 (i.e., in accordance with a decrease of the output impedances from the carrier amplifier 11 and the Doherty circuit) since the peak amplifier 12 has been activated. The control data depicted in FIG. 11 can be also determined based on the parameter design value (logical calculated value) of FIG. 17 and the input/output characteristics of the Doherty circuit (amplifiers 11 and 12) of FIG. 4.

In the Doherty circuit of the fifth embodiment having the above configuration, the power detecting circuit 18A detects an output power from the carrier amplifier 11; the controlling circuit 19A controls the capacity of the variable capacitor 24a of the carrier amplifier 11 based on the detected power and the control data depicted in FIG. 5; the power detecting circuit 18B detects an output power from the peak amplifier 12; and the controlling circuit 19B controls the capacity of the variable capacitor 24b based on the detected power and the control data of FIG. 11.

The configuration ensures the same effects as the foregoing embodiments. In addition, even when the operation of the peak amplifier 12 deviates from an estimated value due to an environmental reason, the resultant error can be corrected by the controlling circuit 19B.

[7] Sixth Embodiment

Figure 12:
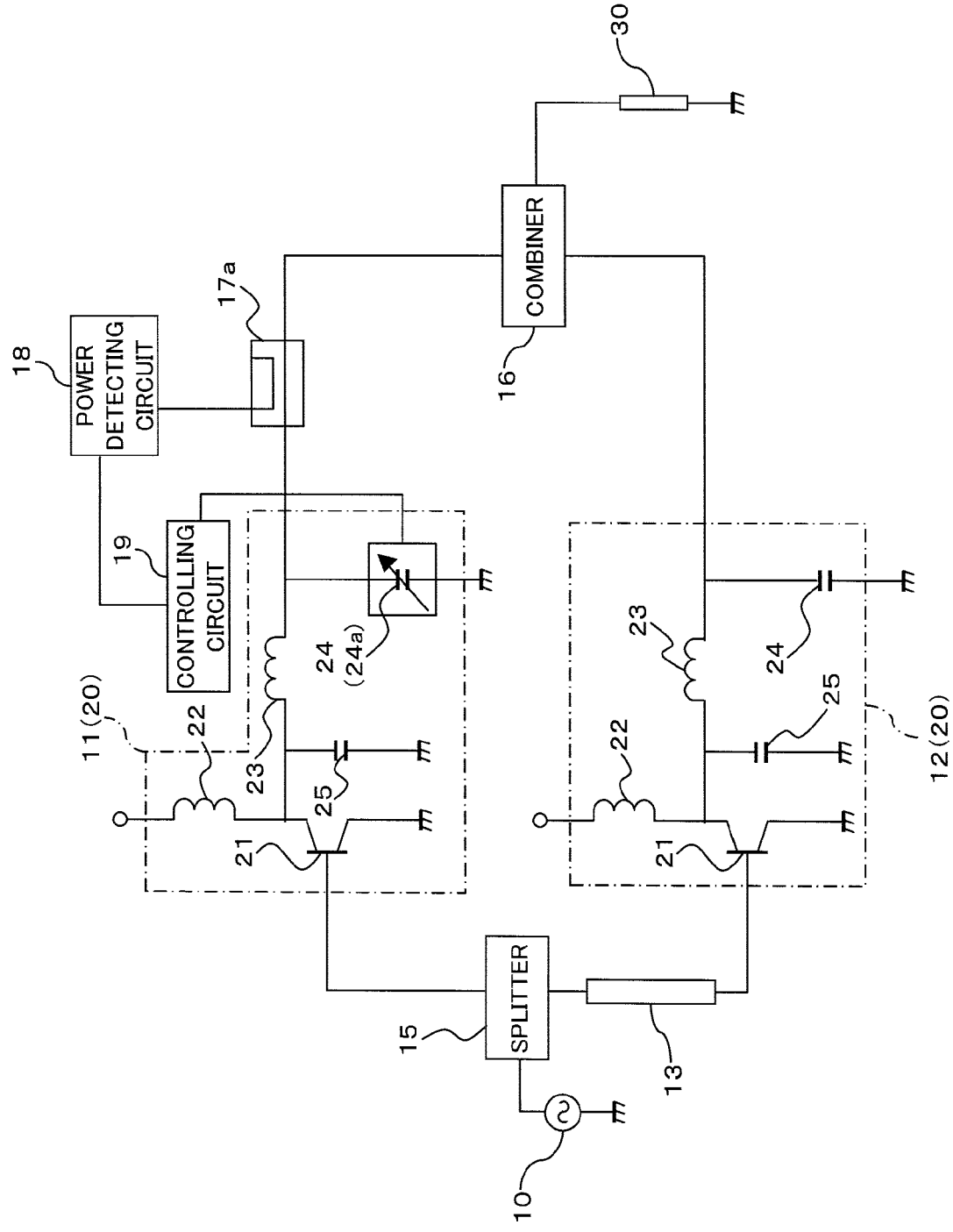
FIG. 12 is a block diagram illustrating the configuration of Doherty circuit to which E-class amplifiers of a sixth embodiment are applied.
Figure 13:
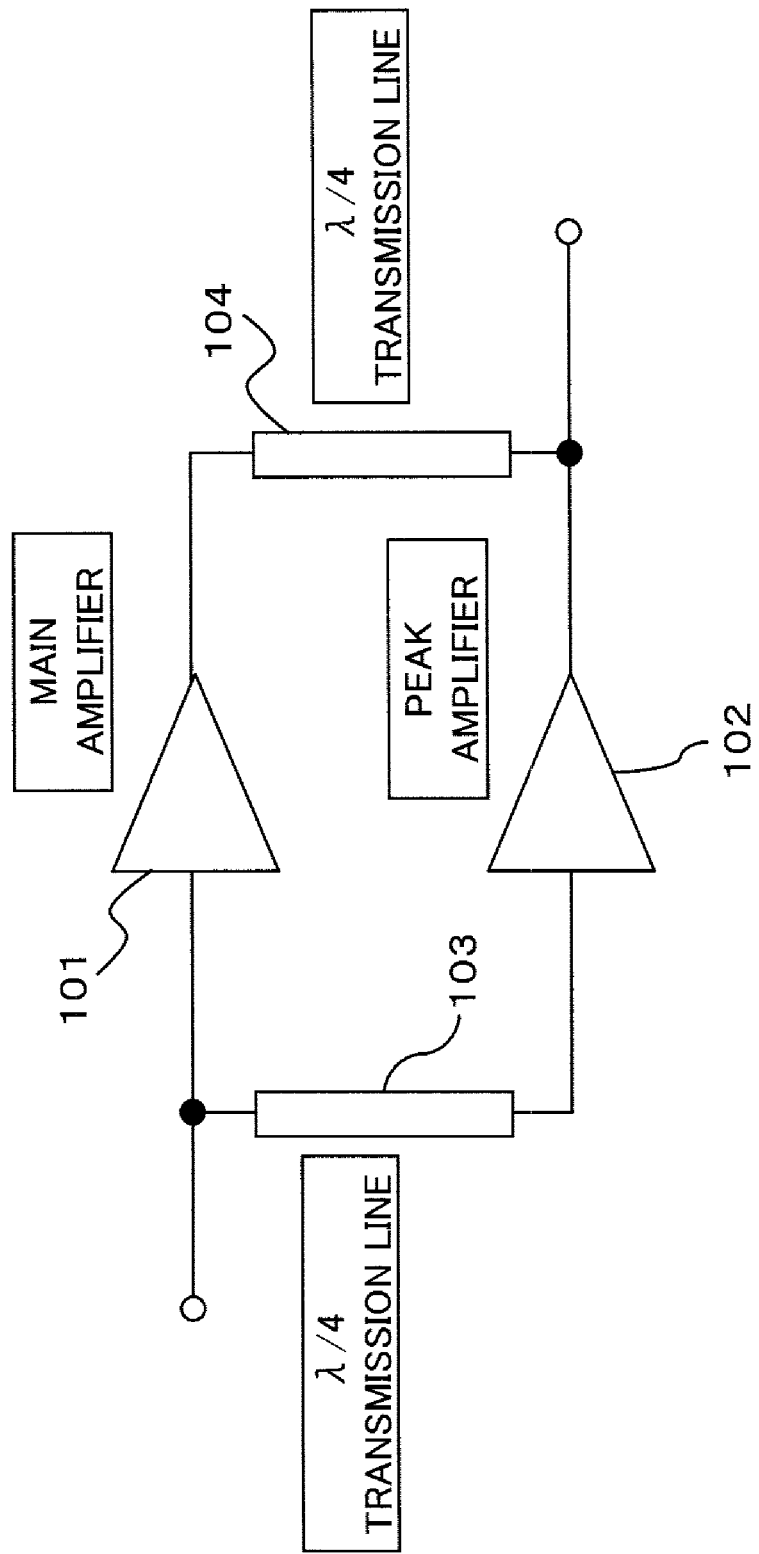
FIG. 13 is a block diagram illustrating the configuration of a typical Doherty circuit.
Figure 14:
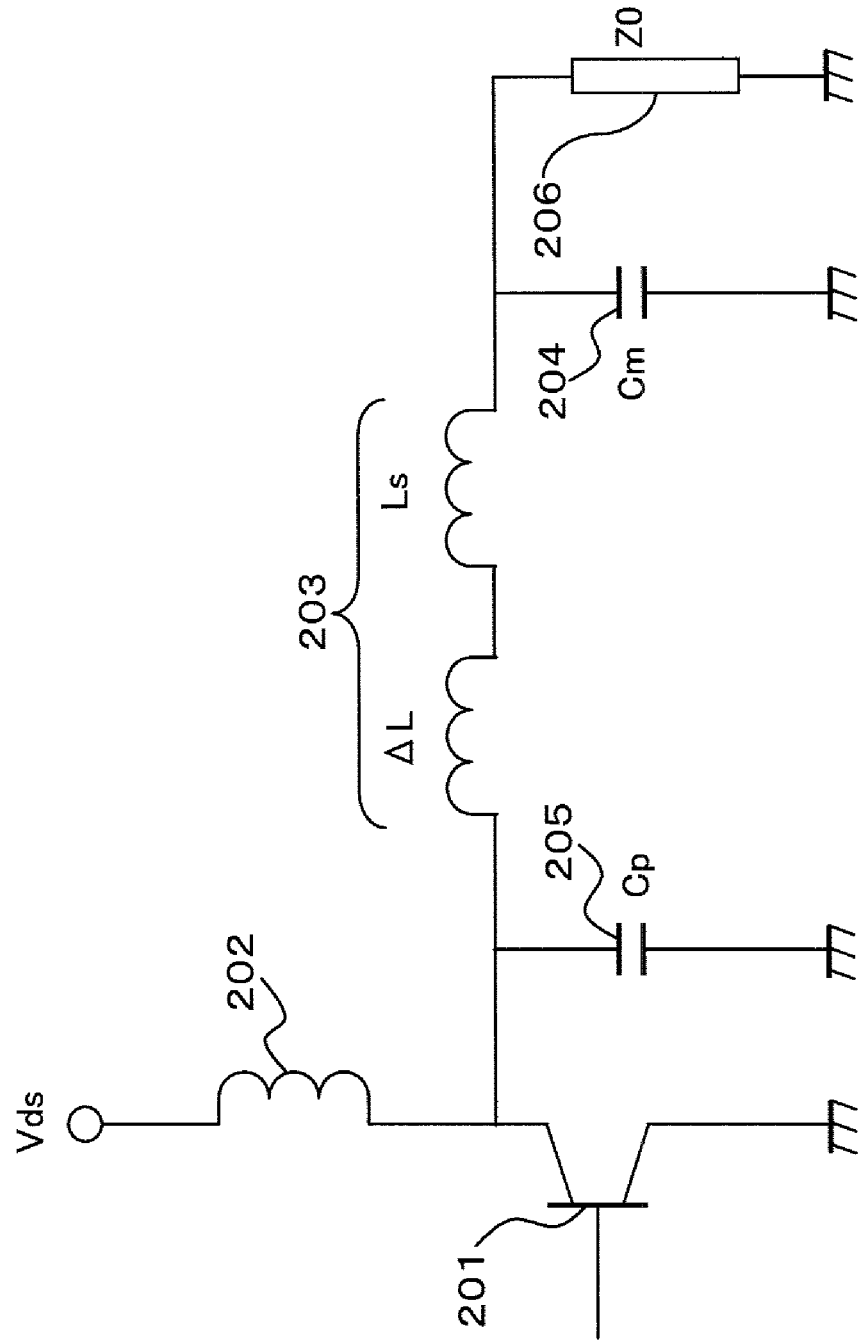
FIG. 14 is a circuit diagram illustrating the configuration of a typical E-class circuit.

FIG. 12 is a block diagram illustrating a Doherty circuit to which E-class circuits are applied according to the fifth (sic) embodiment. The Doherty circuit of FIG. 12 is different from the circuit configuration of FIG. 6 in the points that the coupler 17 is replaced by a coupler 17a having a passing phase of λ/4 (i.e., having a characteristic of shifting (delaying) the phase of an input signal by λ/4 and the λ/4 transmission line 14 at the output end of the carrier amplifier 11 is removed.

Figure 6:
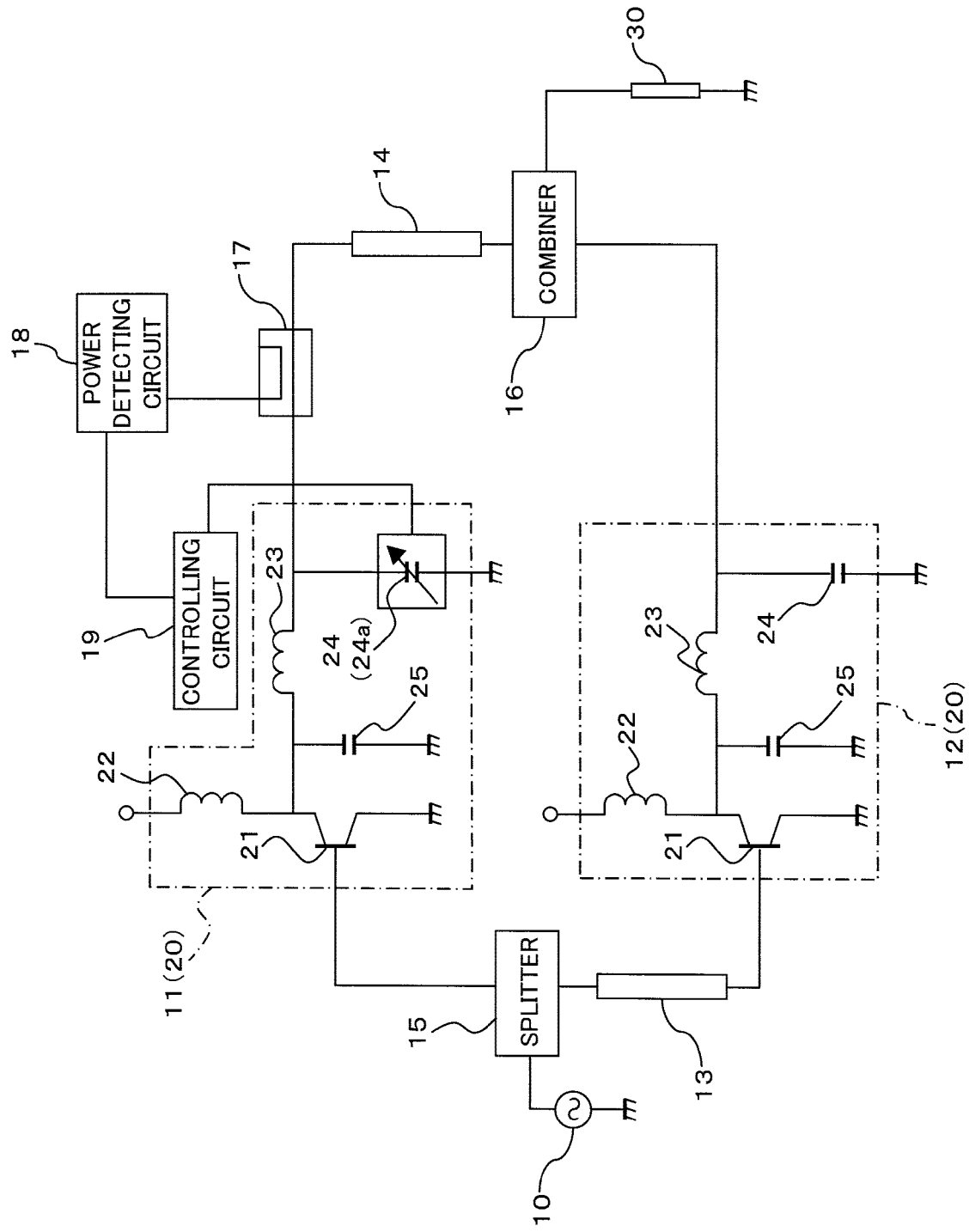
FIG. 6 is a block diagram illustrating the configuration of Doherty circuit to which E-class amplifiers of a second embodiment are applied.

In other words, the Doherty circuit of the sixth embodiment adds (sets) the function (passing phase characteristics) accomplished by the λ/4 transmission line 14 in the circuit configuration of FIG. 6 to the coupler 17a, which thereby adjusts the phase of an output signal from the carrier amplifier 11 such that outputs from the amplifiers 11 and 12 are combined at the same phase in the combiner 16.

With this configuration, the Doherty circuit can be small in size through the reduction in circuit area desired for fabrication. The foregoing embodiments can eliminate the requirement of the λ/4 transmission lines 13 and 14 by optimizing (setting) the passing phase characteristics of the coupler 17 (17A and 17B).

The embodiments ensure at least one of the following effects and the advantages.

(1) Since it is possible to detect an output power from an amplifier (E-class amplifier) having a circuit constant determined so as to satisfy the condition of E-class operation and to control (optimize) the circuit constant (e.g., the capacity of a capacitor) in accordance with the result of the detecting, the amplification efficiency can be made the best at any output power.

(2) Since, even when the output impedance from the first E-class amplifier varies with the level of an input signal, the circuit constant of the E-class amplifier can be controlled in conformity with the variation such that the amplification efficient of the Doherty circuit becomes the best, it is possible to prevent the amplification efficiency from lowering at any level of the input signal.

As mentioned above, the embodiments can control (optimize) the circuit constant of an E-class amplifier in accordance with the output power from the E-class amplifier or a Doherty circuit to which E-class amplifiers are applied, and consequently the amplification efficiency can be the best at any output power. Accordingly, the embodiments seem to be highly useful as a technique to improve efficiency of amplifiers used in radio stations, for instance.

What is claimed is:

1. An amplifying apparatus comprising:
a Doherty amplifying circuit comprising a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power equal to or larger than a specified value, to amplify the input signal;
a combining unit which combines outputs from the first amplifier and the second amplifier;
power detecting unit which detects an output power from the combining unit; and
controlling unit which controls at least the first circuit constant in accordance with the output power detected by the power detecting unit such that an amplifying efficiency of the Doherty amplifying circuit is not reduced.

2. An amplifying apparatus comprising:
a Doherty amplifying circuit comprising a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power larger than a specified value, to amplify the input signal;
a combining unit which combines outputs from the first amplifier and the second amplifier;
power detecting unit which detects an output power from the first amplifier; and
controlling unit which controls at least the first circuit constant in accordance with the output power detected by the power detecting unit such that an amplifying efficiency of the Doherty amplifying circuit is not reduced.

3. The amplifying apparatus according to claim 1, wherein the controlling unit controls the first circuit constant and the second circuit constant in accordance with the output power detected by the power detecting unit.

4. The amplifying apparatus according to claim 1, wherein the controlling unit regards an output power from the combining unit when the second amplifier is activated in response to an increase in power of the input signal as a power threshold, and decreases the first circuit constant in accordance with an increase of the output power detected by the power detecting unit in a range equal to or more than the power threshold.

5. The amplifying apparatus according to claim 4, wherein the controlling unit controls, when the output power detected by power detecting unit is less than the power threshold, the first circuit constant to be constant.

6. The amplifying apparatus according to claim 2, wherein the controlling unit regards an output power from the first amplifier when the second amplifier is activated in response to an increase in power of the input signal as a power threshold, and decreases the first circuit constant in accordance with an increase of the output power detected by the power detecting unit in a range equal to or more than the power threshold.

7. An amplifying apparatus comprising:
   a Doherty amplifying circuit comprising a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power larger equal to or than a specified value, to amplify the input signal;
   a combining unit which combines outputs from the first amplifier and the second amplifier;
   first power detecting unit which detects a first output power from the first amplifier;
   second power detecting unit which detects a second output power from the second amplifier; and
   first controlling unit which controls the first circuit constant in accordance with the first output power detected by the first power detecting unit such that an amplifying efficiency of the Doherty amplifying circuit is not reduced; and
   second controlling unit which controls the second circuit constant in accordance with the second output power detected by the second power detecting unit such that an amplifying efficiency of the Doherty amplifying circuit is not reduced.

8. The amplifying apparatus according to claim 7, wherein the first controlling unit regards an output power from the first amplifier when the second amplifier is activated in response to an increase in power of the input signal as a power threshold, and decreases the first circuit constant in accordance with an increase of the first output power detected by the first power detecting unit in a range equal to or more than the power threshold.

9. The amplifying apparatus according to claim 8, wherein the second controlling unit decreases the second circuit constant in accordance with an increase of the second output power detected by the second power detecting unit.

10. The amplifying apparatus according to claim 2, the power detecting unit comprising a directional coupler which branches a part of an output signal from the first amplifier, and a power detecting circuit which detects the power through detecting a signal from the directional coupler, wherein
   the directional coupler has a passing phase characteristic determined such that the combining unit combines signals output from the first amplifier and the second amplifier at the same phase.

11. A method for controlling a Doherty amplifying circuit comprising a first amplifier having a first circuit constant determined so as to satisfy a condition for E-class operation, and a second amplifier having a second circuit constant determined so as to satisfy a condition for E-class operation, the second amplifier being activated, when an input signal into the first amplifier has a power equal to or larger than a specified value, to amplify the input signal, said method comprising:
   coupling outputs from the first amplifier and the second amplifier;
   detecting an output power obtained by the coupling; and
   controlling at least the first circuit constant in accordance with the output power detected such that an amplifying efficiency of the Doherty amplifying circuit is not reduced.

* * * * *